US 8,062,043 B2

(12) United States Patent
Chen et al.

(10) Patent No.: US 8,062,043 B2
(45) Date of Patent: Nov. 22, 2011

(54) SOCKET CONNECTOR HAVING STOPPING MEMBER ENGAGING WITH LATCH

(75) Inventors: Ke-Hao Chen, Tu-Cheng (TW); Hsiu-Yuan Hsu, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/875,145

(22) Filed: Sep. 3, 2010

(65) Prior Publication Data

US 2011/0053401 A1 Mar. 3, 2011

(30) Foreign Application Priority Data

Sep. 3, 2009 (TW) .............................. 98216230 U

(51) Int. Cl.
*H01R 11/22* (2006.01)
(52) U.S. Cl. ...................................................... 439/266
(58) Field of Classification Search .................. 439/331, 439/330, 73, 70, 71, 74, 75, 266
See application file for complete search history.

(56) References Cited

U.S. PATENT DOCUMENTS

| | | | |
|---|---|---|---|
| 6,350,138 B1 * | 2/2002 | Atobe et al. | 439/266 |
| 6,768,653 B2 | 7/2004 | Ohashi | |
| 2008/0057765 A1 * | 3/2008 | Hsiao et al. | 439/259 |

* cited by examiner

*Primary Examiner* — Javaid Nasri
(74) *Attorney, Agent, or Firm* — Andrew C. Cheng; Wei Te Chung; Ming Chieh Chang

(57) ABSTRACT

A socket connector for receiving an IC package includes a base with a plurality of contacts received therein, an adapter mounted on the base for carrying the IC package and having a plurality of through holes, a lid mounted above the adapter and movable along a vertical direction relative to the base, and a rotatable latch driven by the lid and capable of pressing the IC package. The contacts are able to pass through the through holes and contact the IC package, respectively. A stopping member is located under the latch and capable of preventing overturn of the latch.

14 Claims, 5 Drawing Sheets

SOCKET CONNECTOR HAVING STOPPING MEMBER ENGAGING WITH LATCH

BACKGROUND OF THE INVENTION

1. Field of the Invention

The present invention relates to a socket connector, and more particularly to a socket connector having a hard-stop limiting an overturn of a latch interlinked to a moveable lid so as to prevent damage to an IC package received therein.

2. Description of Related Art

An IC package is generally communicated with a PCB (Printed Circuit Board) by means of an electrical connector which is mounted onto the PCB and receives the IC package therein. U.S. Pat. No. 6,768,653 issued to Ohashi on Jul. 27, 2004, discloses a typical electrical connector for that purpose. The electrical connector includes a base for carrying the IC package thereon, a lid located above the base and movable along a vertical direction relative to the base, and a number of latches interlinked to and driven by the lid. When the lid is depressed downwardly against spring members that support the lid, the latches are driven and transited to an opened position, and the IC package is then able to be disposed into the base. When the pressure on the lid is released, the lid then moves upwardly due to potential elastic force released from the compressed spring members, and the latches rotate toward the IC package and finally securely lock the IC package. Particularly referring to FIGS. 1-7 of Ohashi, the lid has a guiding plate extending downwardly with a guiding slot provided therein. Correspondingly, the base has a protrusion sliderably received in the guiding slot. The protrusion and guiding slot engage each other and jointly serve as a stopping manner that prevents over-movement of the lid, especially the upward movement thereof.

The design of the stopping manner suggested in Ohashi is able to prevent over-upward movement of the lid and subsequent over-load onto the IC package. However, the guiding plate is relatively vulnerable and fragile and is likely to be damaged when endured with a large pressure or an un-balanced pressure.

In view of the above, an improved socket connector capable of effectively limiting the final movement of a lid is desired.

SUMMARY OF THE INVENTION

Accordingly, an object of the present invention is to provide an improved socket connector having a reliable stopping member capable of preventing excessive pressure deployed onto the IC package resulted from overturn of a latch interlinked to a lid.

According to one aspect of the present invention, there is provided a socket connector for receiving an IC package. The socket connector includes a base with a plurality of contacts received therein, an adapter mounted on the base for carrying the IC package and having a plurality of through holes, a lid mounted above the adapter and movable along a vertical direction relative to the base, and a rotatable latch driven by the lid and capable of pressing the IC package. The contacts are able to pass through the through holes and then contact the IC package, respectively. A stopping member is located under the latch and capable of preventing overturn of the latch.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
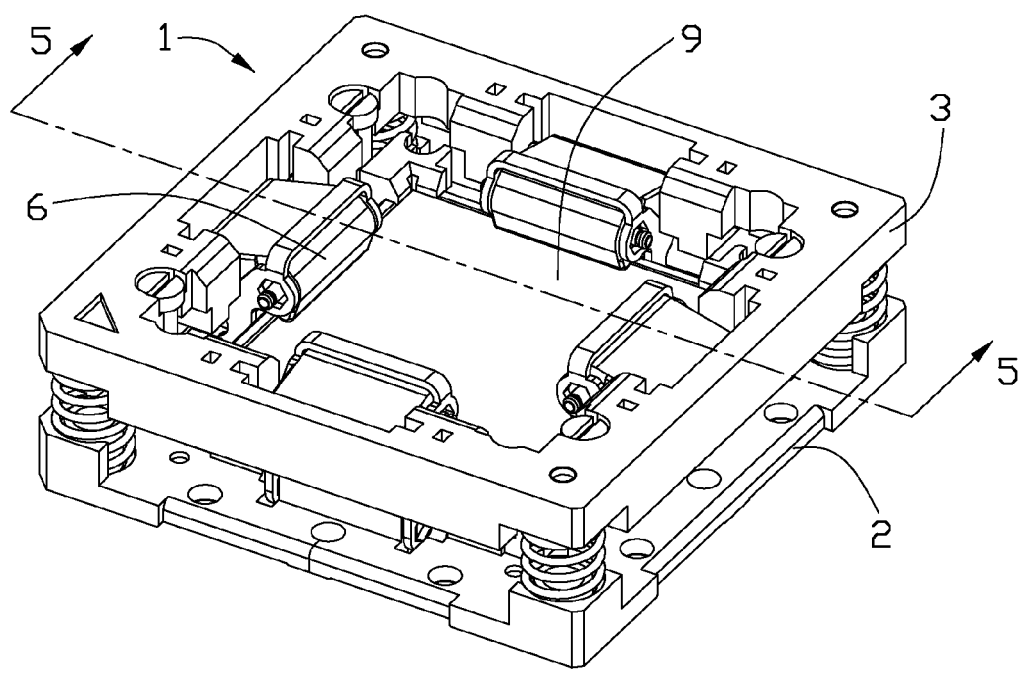
FIG. 1 is a perspective view of a socket connector in a closed position in accordance with a preferred embodiment of the present invention.
Figure 2:
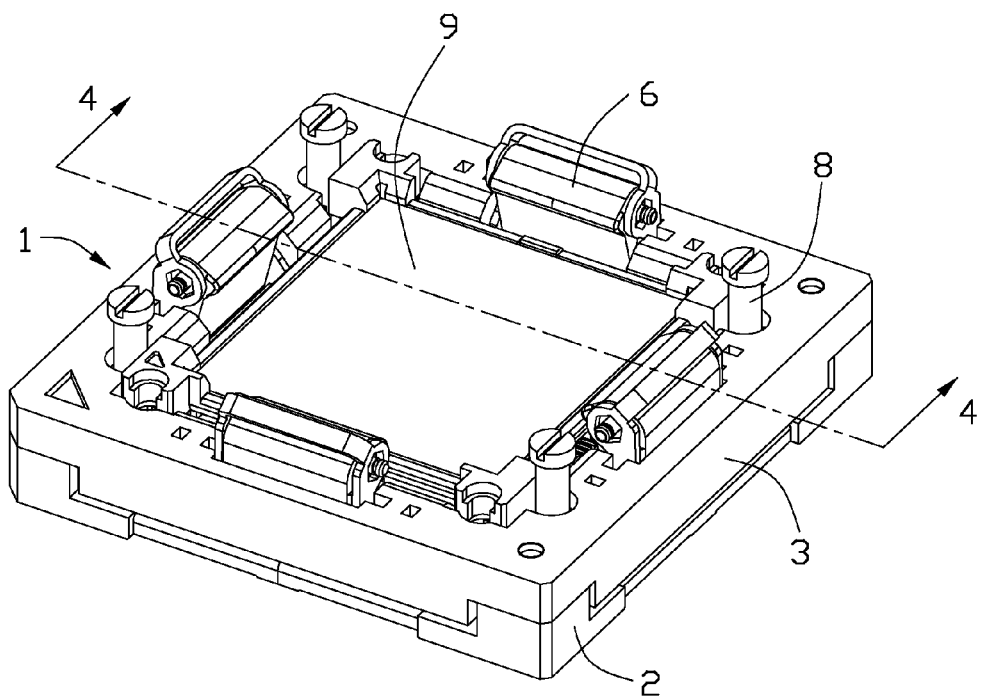
FIG. 2 is a perspective view of the socket connector in an opened position in accordance with the preferred embodiment of the present invention.

FIGS. 1 and 2 respectively demonstrate a burn-in socket situated in an opened and closed positions. Also referring to the exploded view of FIG. 3, the socket connector 1 is provided for receiving and testing an IC package 9. The socket connector 1 includes a base 2, an adapter 5 mounted on the base 2 for carrying the IC package 9 thereon, a lid 3 mounted upon the base 2 and adapter 5, and a plurality of latches 6 driven by the lid 3 to lock the IC package 9. A plurality of contacts 4 are received in the base 2. The adapter 5 has a plurality of through holes 51, and the curved contacts 4 elastically support the adapter 5 so that the adapter 5 is floatable relative to the base 2. The contacts 4 extend through the through holes 51 of the adapter 5 and then contact the IC package 9. The lid 3 is movable relative to the base 2 and the adapter 5 in a vertical direction and is able to be turned between an upper position and a lower position.

The lid 3 is supported by a plurality of spring members 7 which stand upon the base. A plurality of screws 8 pass through corners of the lid 3 and are then fastened to the base 2. The top position of the lid 3 is therefore constrained by the screws 8. When the lid 3 is pressed downwardly against the spring members 7, the headers of screws 8 are spaced from the lid 3.

Each latch 6 is interlinked to the base 2 and the lid 3 by a pair of pivots 60, 61. When the lid 3 moves downwardly from the upper position to the lower position, the latches 6 rotate upwardly and rearwardly to the opened positions, so that the IC package 9 is able to be placed on or taken away from the adapter 5. When the pressure applied on the lid 3 is released, the lid 3 moves upwardly from the lower position to the upper position due to the elastic force released from the spring members 7. And the latches 6 rotate downwardly and forwardly so that the IC package 9 is pressed and locked by the latches 6. The latch 6 includes a contacting portion 62 capable of directly contacting the IC package 9 and a bottom surface 63 at a rearward position of the contacting portion 62.

Figure 3:
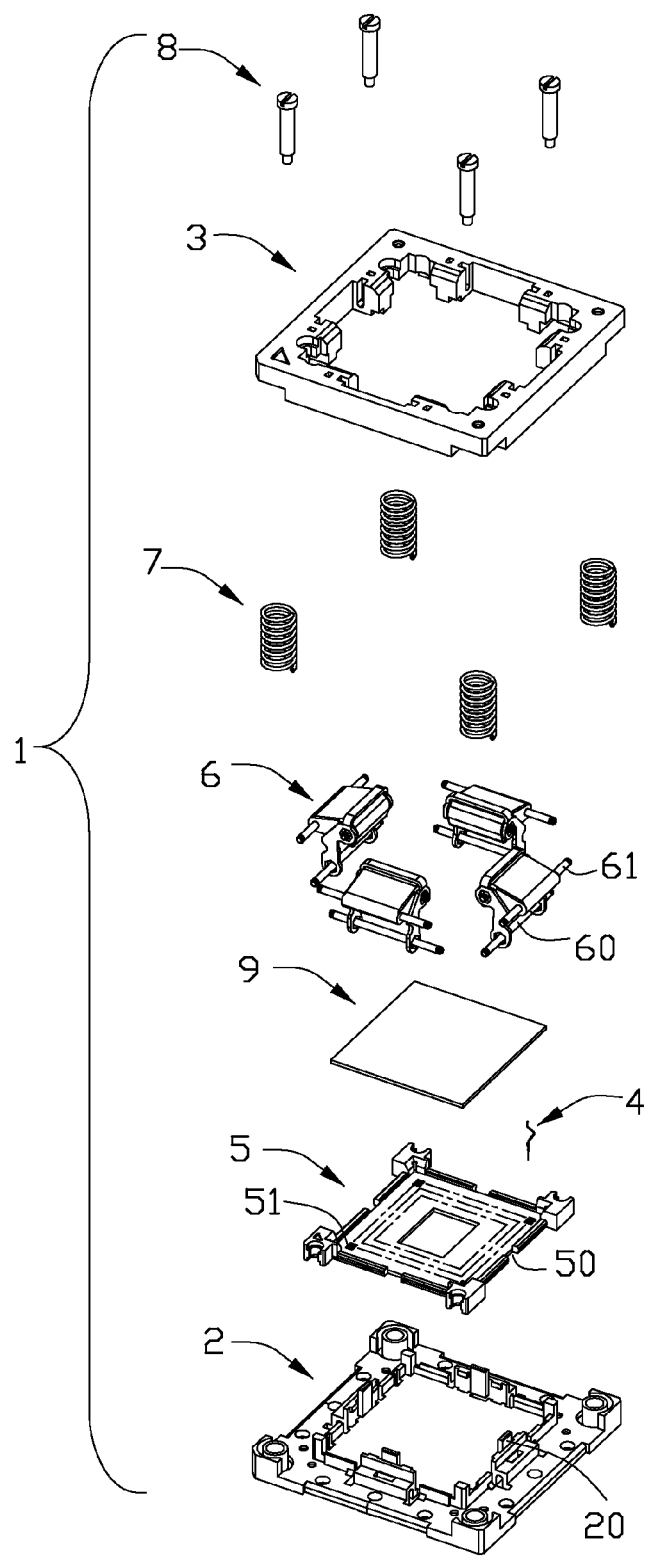
FIG. 3 is an exploded perspective view of the socket connector shown in FIG. 1 and FIG. 2.
Figure 4:
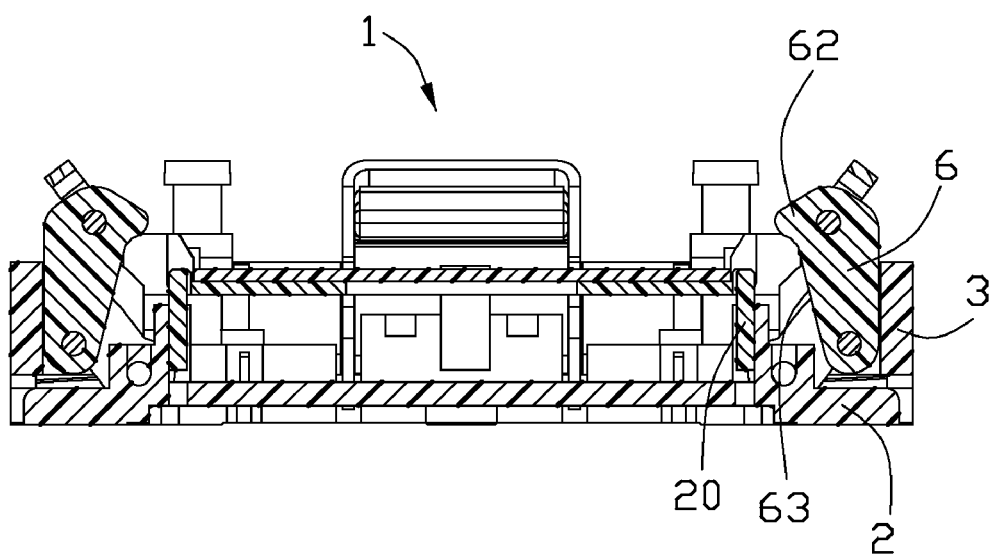
FIG. 4 is a cross-sectional view of the socket connector, taken along the line 4-4 in FIG. 2.
Figure 5:
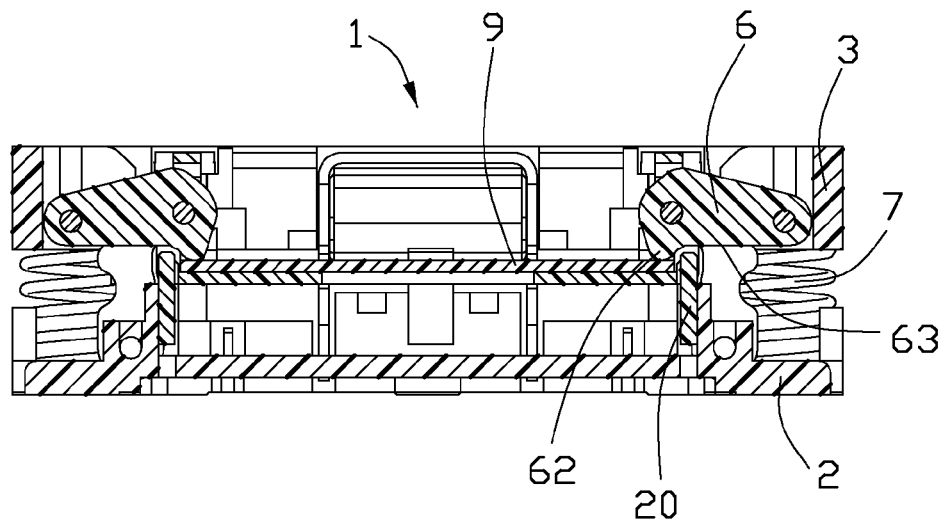
FIG. 5 is a cross-sectional view of the socket connector, taken along the line 5-5 in FIG. 1.

Referring to FIGS. 3-5, a stopping member 20 is provided under the bottom surface 63 of the latch 6. According to the preferred embodiment, the stopping member 20 integrally extends upwardly from the base 2. Alternatively, a separated stopping member that assembled onto the base is also available. The adapter 5 has a plurality of notches 50 at edges thereof, allowing corresponding stopping members 20 to pass through. Particularly referring to FIG. 5, when the latch 6 is located in the closed position and presses the IC package 9 under a normal condition, the bottom surface 63 of the latch 6 is spaced from the stopping member 20 with a gap therebetween. In a rare case that the spring members 7 provides an excessively large force, the latch will provide an over-pressure on the IC package 9, which may cause the contacts 4 under the IC package 9 or other elements to be damaged. In the present invention, the stopping member 20 is used to engage with and support the latch 6 so as to prevent the latch 6 from giving excessively large pressure to the IC package 9. In addition, the stopping member 20 can also prevent the over-pressure of the latches 6 that caused due to deformation of special elements of the socket connector 1.

While preferred embodiments in accordance with the present invention has been shown and described, equivalent modifications and changes known to persons skilled in the art according to the spirit of the present invention are considered within the scope of the present invention as defined in the appended claims.

What is claimed is:

1. A socket connector for receiving an IC package, comprising:
   a base with a plurality of contacts received therein;
   an adapter mounted on the base for carrying the IC package and having a plurality of through holes, the contacts being able to pass through the through holes and then contact the IC package, respectively;
   a lid mounted above the adapter and movable along a vertical direction relative to the base;
   a rotatable latch driven by the lid and capable of pressing the IC package; and
   a stopping member located under the latch and capable of preventing overturn of the latch;
   wherein the latch is spaced away from the stopping member when the latch is out of engagement with the IC package.

2. The socket connector as claimed in claim 1, wherein the latch does not directly contact the stopping member under a condition that latch normally presses the IC package.

3. The socket connector as claimed in claim 2, wherein the stopping member extends upwardly from the base.

4. The socket connector as claimed in claim 3, wherein the adapter defines a notch and the stopping member extends through the adapter via the notch.

5. The socket connector as claimed in claim 1, wherein the lid is further constrained by a screw which passes thought the lid and is fastened to the base.

6. The socket connector as claimed in claim 1, wherein the stopping member is positioned beyond a contour of the IC package in a horizontal direction.

7. A socket connector for receiving an IC package, comprising:
   a socket body having a plurality of contact retained therein, the IC package being received within the socket body;
   a lid located above the socket body and supported by a plurality of spring members, the lid being able to be turned between an upper position and a bottom position;
   a rotatable latch driven by the lid and able to be turned between a closed position corresponding to the upper position of the lid, and an opened position corresponding to the bottom position of the lid; and
   a stationary stopping member extending upward form the socket body and positioned under the latch so as to prevent the latch from moving beyond a predetermined position.

8. The socket connector as claimed in claim 7, wherein the latch does not direct contact with the stopping member under a condition that latch normally presses the IC package.

9. The socket connector as claimed in claim 8, wherein the socket body comprises a base and an adapter floatably mounted upon the base, the stopping member extending upwardly from the base.

10. The socket connector as claimed in claim 9, wherein the adapter defines a notch and the stopping member extends through the adapter via the notch.

11. The socket connector as claimed in claim 7, wherein the lid is further constrained by a screw which passes thought the lid and is fastened to the base.

12. The socket connector as claimed in claim 7, wherein the stopping member is positioned beyond the contour of a IC package in a horizontal direction.

13. A socket connector for receiving an IC (Integrated Circuit) package, comprising:
   a socket body having a plurality of contacts therein;
   a lid mounted upon the socket body and up and down moveable in a vertical direction between upper and lower positions;
   a rotatable latch including a lower part and an upper part discrete from each other while each having two opposite inner and outer ends under condition that said lower part and said upper part are pivotally assembled to each other at both said inner ends, while the outer end of the lower part pivotally assembled to the base and the outer end of the upper part pivotally assembled to the lid so as to form a pressing portion at said inner ends for downwardly pressing the IC package during use; wherein
   said base is further equipped with a stopper intimately confronting said inner ends when the lid is located in the upper position.

14. The socket connector as claimed in claim 13, wherein said socket body includes a base and an adaptor surrounded by said base, and said latch is pivotally mounted to the base.

* * * * *